United States Patent [19]

Kim

[11] Patent Number: 5,461,004
[45] Date of Patent: Oct. 24, 1995

[54] METHOD FOR FABRICATING CONNECTION DEVICE WITH REDUCED AREA OF HIGHLY INTEGRATED SEMICONDUCTOR DEVICE

[75] Inventor: Jae K. Kim, Kyoungki-do, Rep. of Korea

[73] Assignee: Hyundai Electronics Industries Co., Ltd., Rep. of Korea

[21] Appl. No.: 173,099

[22] Filed: Dec. 27, 1993

[30] Foreign Application Priority Data

Dec. 30, 1992 [KR] Rep. of Korea ................ 1992-26733

[51] Int. Cl.⁶ .......................... H01L 21/28; H01L 21/44
[52] U.S. Cl. ........................ 437/195; 437/978; 437/228
[58] Field of Search ........................ 437/195, 978, 437/228

[56] References Cited

U.S. PATENT DOCUMENTS

| | | | |
|---|---|---|---|
| 4,997,790 | 3/1991 | Woo et al. | 437/195 |
| 5,026,666 | 6/1991 | Hills et al. | 437/195 |
| 5,158,910 | 11/1992 | Cooper et al. | 437/195 |

*Primary Examiner*—George Fourson
*Assistant Examiner*—C. Everhart
*Attorney, Agent, or Firm*—Merchant, Gould, Smith, Edell, Welter & Schmidt

[57] ABSTRACT

A semiconductor connection device capable of reducing the area of connection portions by minimizing an overlapping area between a lower first conduction line and an upper second conduction line at a contact region defined in the first conduction line upon connecting the second conduction line to the first conduction line. The minimized overlapping area can be obtained by forming the second conduction line in a self-aligned manner.

3 Claims, 4 Drawing Sheets

METHOD FOR FABRICATING CONNECTION DEVICE WITH REDUCED AREA OF HIGHLY INTEGRATED SEMICONDUCTOR DEVICE

BACKGROUND OF THE INVENTION

1. Field of the Invention

The present invention elates to a method for fabricating a connection device of a highly integrated semiconductor device, and more particularly to a semiconductor connection device capable of reducing the total a ea of connection portions by minimizing an overlap area between a lower first conduction line and an upper second conduction line at a contact region defined in the first conduction line upon connecting the second conduction line to the first conduction line.

2. Description of the Prior Art

In general fabrication of a semiconductor device, a contact hole is formed in an inter-layer insulating film formed over a first conduction line by etching the insulating film so as to electrically connect a second conduction line to the first conduction line through the insulating film. A second conduction layer is deposited and then patterned to form the second conduction line. The second conduction line is electrically connected to the first conduction line through the contact hole. Upon forming the second conduction line, the contact hole is fully overlapped with the second conduction line because of the reason to be described hereinafter. For forming the second conduction line to be overlapped with the first conduction line, the above-mentioned patterning step is carried out subject to a condition that the first conduction line is overlapped with a mask which is preferably comprised of a photoresist film. If the mask covers the contact hole incompletely, the first conduction line may be damaged at the portion disposed beneath the uncovered portion of the contact hole during the patterning of the second conduction line. As a result, poor semiconductor devices may be produced.

Therefore, masks for forming the contact hole and the conduction line should be designed in accordance with a specific regulation.

In other words, the mask to be used for forming the contact hole for connecting the second conduction line to the first conduction line and the mask to be used for forming the second conduction line should be designed such that the mask for the second conduction line is always overlapped with the contact hole. When the mask for the second conduction line covers the contact hole incompletely, the first conduction line may be partially etched through the contact hole during the patterning of the second conduction line, so that the first conduction line may have a damaged portion. Where the mask for the second conduction line has the same size as the contact hole, it may cover the contact hole incompletely due to a limitation on accuracy and a variation in critical dimension encountered in fabrication of masks, and a misalignment, a distortion of lenses and a variation in critical dimension occurring upon formation of a pattern on a wafer. As a result, the first conduction line may have a damaged portion, as mentioned above. Taking the above-mentioned parameters into consideration, the mask for the second conduction line is formed to have a size larger than that of the contact hole by a predetermined dimension so that it can cover the contact hole completely. However, this results in an increased dimension of a connection device finally produced.

FIG. 1 is a plan view of a connection device in accordance with the prior art. As shown in FIG. 1, the conventional connection device has a structure wherein each second conduction line C is connected to a corresponding first connection line A through a contact hole B. It is noted that this structure has an increased connection area because of the size of the second conduction line overlapped with the contact hole B. In other words, the second conduction line C has an increased area for overlapping with the contact hole B, thereby increasing the connection area.

FIG. 2 illustrates another conventional structure wherein each second conduction line C is insufficiently overlapped with the corresponding contact hole B so that the connection area can be considerably reduced. Even though this structure has a greatly reduced connection area, misalignment of the conduction lines occurs. In other words, the second conduction line C may be misaligned with the contact hole B, so that the contact hole B has a portion not covered with the second conduction line C. This means that the first conduction line A may be damaged due to the uncovered contact hole portion upon formation of the second conduction line C.

FIGS. 3A to 3C are sectional views taken along the line a-a' of FIG. 2, respectively illustrating a method of forming a connection device resulting in the above-mentioned structure wherein the second conduction line C is insufficiently overlapped with the contact hole B.

In accordance with this method, an inter-device isolation insulating film 2 and a first conduction line 3 comprised of impurity-diffused regions are formed on predetermined portions of a semiconductor substrate 1, respectively, as shown in FIG. 3A. Over the entire exposed surface of the resulting structure, an inter-layer insulating film 4 is formed. Thereafter, a contact hole 10 is formed in the insulating film 4 so that the first conduction line 3 is exposed through the contact hole 10.

As shown in FIG. 3B, a conduction material layer 5 for a second conduction line is then formed over the entire exposed surface of the resulting structure so that it is in contact with the contact hole 10. Subsequently, a mask 6 for the second conduction line is formed on the conduction material layer 5. FIG. 3B shows a condition that the mask 6 covers the contact hole 10 insufficiently. Such a condition is results from a misalignment and a variation in critical dimension occurring in formation of the mask 6.

FIG. 3C shows second conduction lines 5' formed by etching predetermined portions of the conduction material layer 5 by use of the mask 6 shown in FIG. 3B. By referring to FIG. 3C, it can be found that the first conduction line 3 has been etched through the contact hole portion not overlapped with the mask 6, thereby forming a damaged portion 20. The damaged portion 20 resulting from the etching of the first conduction line 3 penetrates the substrate 1, thereby resulting in a poor semiconductor device.

For preventing such a damaged portion from being formed in fabrication of a connection device, the mask 6 for the second conduction line is constructed to cover the contact hole 10 completely in accordance with the conventional method. However, such a structure causes a problem that the connection area is naturally increased because the second conduction line still remaining after a subsequent etching step extends beyond the boundary of the contact hole.

SUMMARY OF THE INVENTION

Therefore, an object of the present invention is to provide a semiconductor connection device capable of considerably reducing the area between connection portions by minimizing an overlap area between a lower first conduction line and an upper second conduction line at a contact region defined in the first conduction line upon connecting the second conduction line to the first conduction line.

In accordance with the present invention, this object can be accomplished by providing a method for fabricating a connection device of a highly integrated semiconductor device, comprising the steps of: (a) forming a first conduction line on a predetermined portion of the upper surface of a semiconductor substrate, forming an inter-layer insulating film over the entire exposed surface of the resulting structure, and then forming a contact hole in said inter-layer insulating film to partially expose said first conduction line through said contact hole; (b) coating a photoresist film over the entire exposed surface of the resulting structure, patterning said photoresist film by use of a photolithography, and thereby forming a mask for a second conduction line comprising of a portion of the photoresist film disposed in the contact hole and on the portion of the inter-layer insulating film adjacent to the contact hole; (c) forming an insulating film over the entire exposed surface of the resulting structure, etching back said insulating film to a predetermined depth, and thereby exposing the upper surface of said mask; (d) removing the mask, and depositing a conduction material layer for a second conduction line over the entire exposed surface of the resulting structure, said conduction material layer having a thickness determined such that the conduction material layer is upwardly protruded from the upper surface of the insulating film by a height larger than ½ of the lateral width of the mask, thereby filling a region defined after the removal of the mask; and (e) etching back the conduction material layer, and thereby forming the second conduction line extending along said region defined after the removal of the mask.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
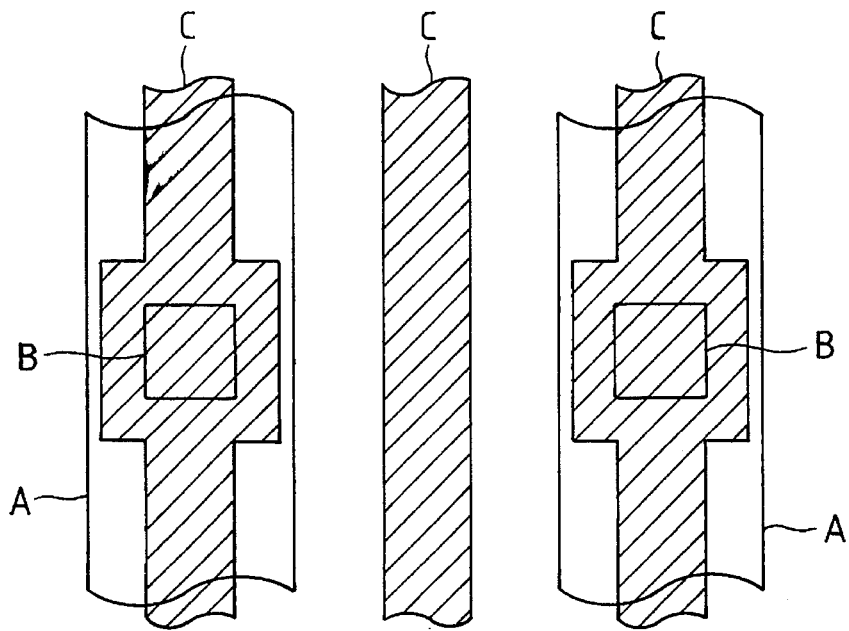
FIG. 1 is a plan view of a highly integrated semiconductor device having a connection device fabricated in accordance with the prior art.
Figure 2:
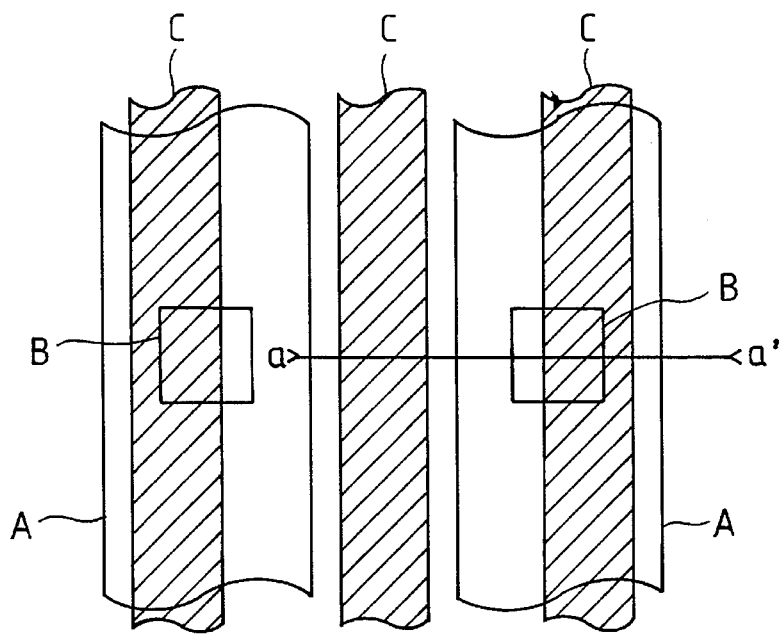
FIG. 2 is a plan view of a highly integrated semiconductor device having a connection device with a reduced contact area fabricated in accordance with the prior art.
Figure 3A:
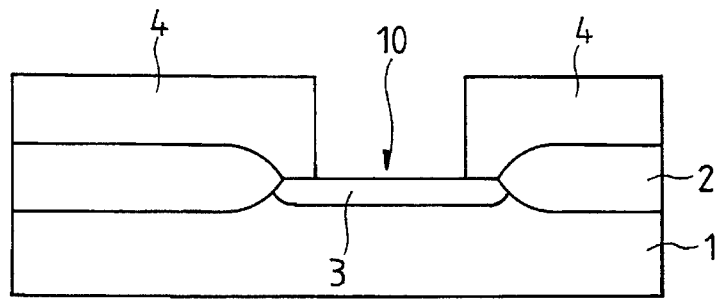
FIGS. 3A to 3C are sectional views respectively illustrating a conventional method for fabricating a connection device.
Figure 3B:
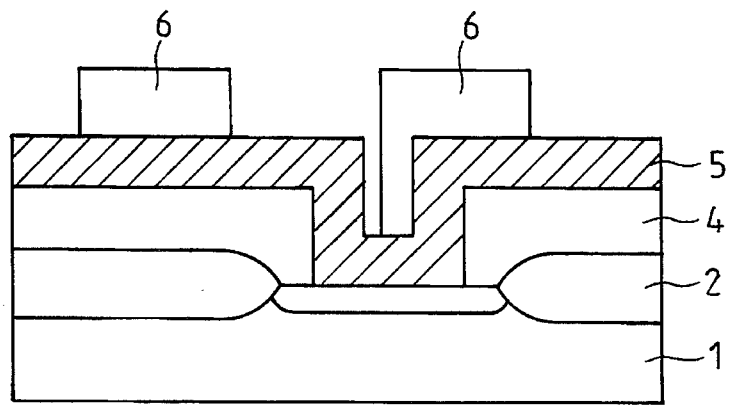
Figure 3C:
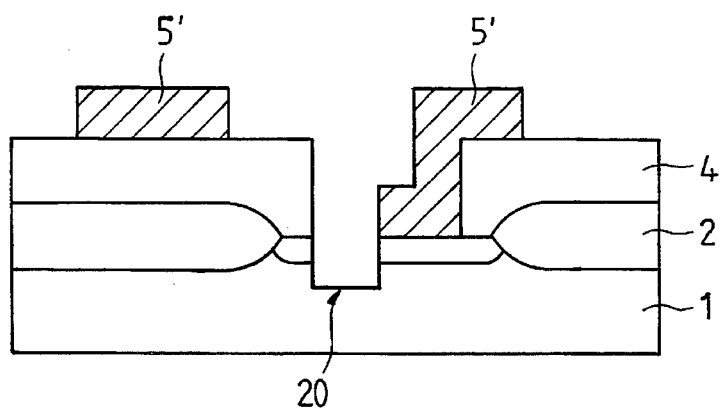

FIGS. 4A to 4D are sectional views respectively illustrating a method for fabricating a connection device in accordance with the present invention. In FIGS. 4A to 4D, elements corresponding to those in FIGS. 3A to 3C are denoted by the same reference numerals. Although first conduction lines are illustrated as impurity diffusion regions formed in a semiconductor substrate, they may be constituted by a conduction material layer formed over an insulating film on the semiconductor substrate.

Figure 4A:
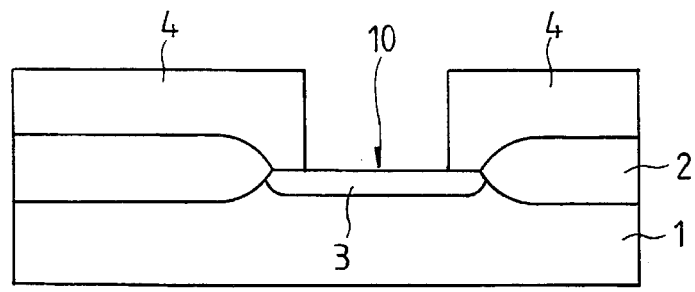
FIGS. 4A to 4D are sectional views respectively illustrating a method for fabricating a connection device in accordance with the present invention.

In accordance with the present invention, an inter-device isolation insulating film 2 and a first conduction line 3 comprised of impurity-diffused regions are formed on predetermined portions of a semiconductor substrate 1, respectively, as shown in FIG. 4A. Over the entire exposed surface of the resulting structure, an inter-layer insulating film 4 is formed. Thereafter, the insulating film 4 is etched to form a contact hole 10.

Figure 4B:
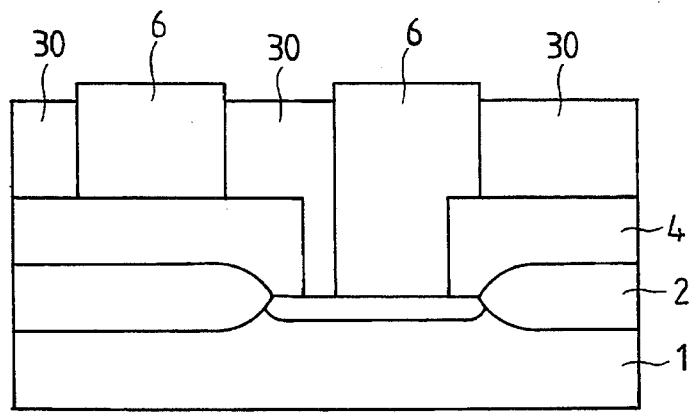

A photoresist film is then coated over the entire exposed surface of the resulting structure, as shown in FIG. 4B. The photoresist film is then patterned by use of a photolithography so as to form a mask 6 to be used for forming a second conduction line. The mask 6 is constituted by the photoresist film portions respectively disposed at the contact hole 10 and on the portion of the inter-layer insulating film 4 adjacent to the contact hole 10. Subsequently, an insulating film 30 comprised of, for example, a spin-on-glass layer is formed over the entire exposed surface of the resulting structure in order to have a smooth surface. The insulating film 30 is then etched back so that the upper surface of the mask 6 can be exposed.

By referring to FIG. 4B, it can be found that the mask 6 is not positioned just over the contact hole 10, but positioned to partially cover the contact hole 10 and the insulating film 4, respecting. It is noted that such a position of the mask 6 has not resulted from any option, but resulted from a misalignment margin and a variation in critical dimension. Since the mask 6 is not formed to have a size completely covering the contact hole 10 in accordance with the present invention, it is positioned to cover the contact hole 10 partially and the insulating film 4 partially, as mentioned above.

Figure 4C:
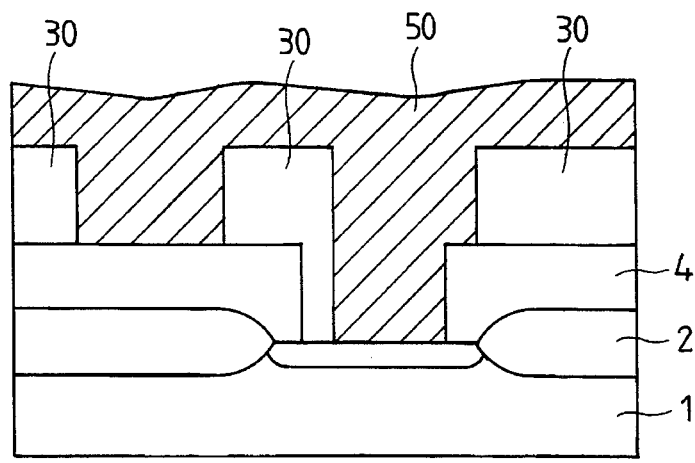
Figure 4D:
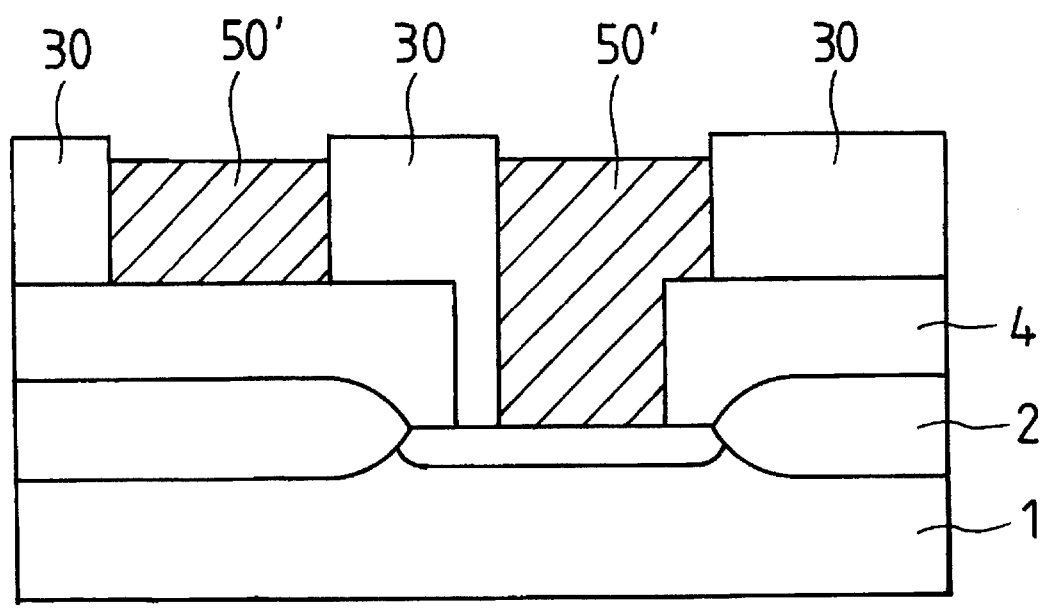

After the formation of the insulating film 30, the mask 60 is removed, as shown in FIG. 4C. Then, a conduction material layer 50 for a second conduction line is deposited over the entire exposed surface of the resulting structure. At this time, the thickness of the conduction material layer 50 is determined such that the conduction material layer 50 is upwardly protruded from the upper surface of the insulating film 30 by a height larger than ½ of the lateral width of the mask 6 when viewed in FIG. 4C. By such thickness, the conduction material layer 50 can fill regions defined after the removal of the mask 6 and including the contact hole 10, without generating any void Subsequently, the conduction material layer 50 is etched back so that the upper surface of the insulating film 30 is exposed, as shown in FIG. 4D. By this etch-back step, a second conduction line 50' is formed to extend along each region defined after the removal of the mask 6. By referring to FIG. 4D, it can be found that the portion of the contact hole 10 not covered with the mask 6 is protected by the insulating film 30. As a result, there is no damaged portion of the first conduction line 3, even though the first conduction line 3 includes a portion disposed beneath the portion of the contact hole 10 not covered with the mask 6.

As apparent from the above description, the present invention provides a semiconductor connection device capable of reducing the area of connection portions thereof by minimizing an overlapping area between a lower first conduction line and an upper second conduction line at a contact region defined in the first conduction line upon connecting the second conduction line to the first conduction line. Thus, a more highly integrated semiconductor device can be fabricated.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a connection device of a highly integrated semiconductor device, comprising the steps of:

(a) forming a first conduction line on a portion of a semiconductor substrate, forming an inter-layer insulating film on said first conduction line and said semiconductor substrate, and then forming a contact hole in said inter-layer insulating film to partially expose said first conduction line through said contact hole;

(b) coating a photoresist film over the inter-layer insulating film and said first conduction line exposed through said contact hole and patterning said photoresist film by use of a photolithography process to form first exposed regions and a mask for a second conduction line including space occupied by said photoresist film in a first portion of the contact hole and in a second portion on the inter-layer insulating film adjacent to the contact hole;

(c) forming an insulating film over said photoresist film and said first exposed regions and etching back said insulating film to expose the upper surface of said mask;

(d) removing the mask to provide second exposed regions and depositing a conduction material layer for the second conduction line over the first and second exposed regions, said conduction material layer having a thickness determined such that the conduction material layer is upwardly protruded from the upper surface of the insulating film by a height larger than ½ of the lateral width of the mask, thereby filling a subspace equivalent to the space in the first portion of the contact hole defined after the removal of the mask; and (e) etching back the conduction material layer, and thereby forming the second conduction line extending along said second exposed regions defined after the removal of the mask.

2. A method in accordance with claim 1, wherein said insulating film formed at said step (c) is comprised of a spin-on-glass layer.

3. A method in accordance with claim 1, wherein said insulating film formed at said step (c) is comprised of a polyimide layer.

* * * * *